Figure 1:
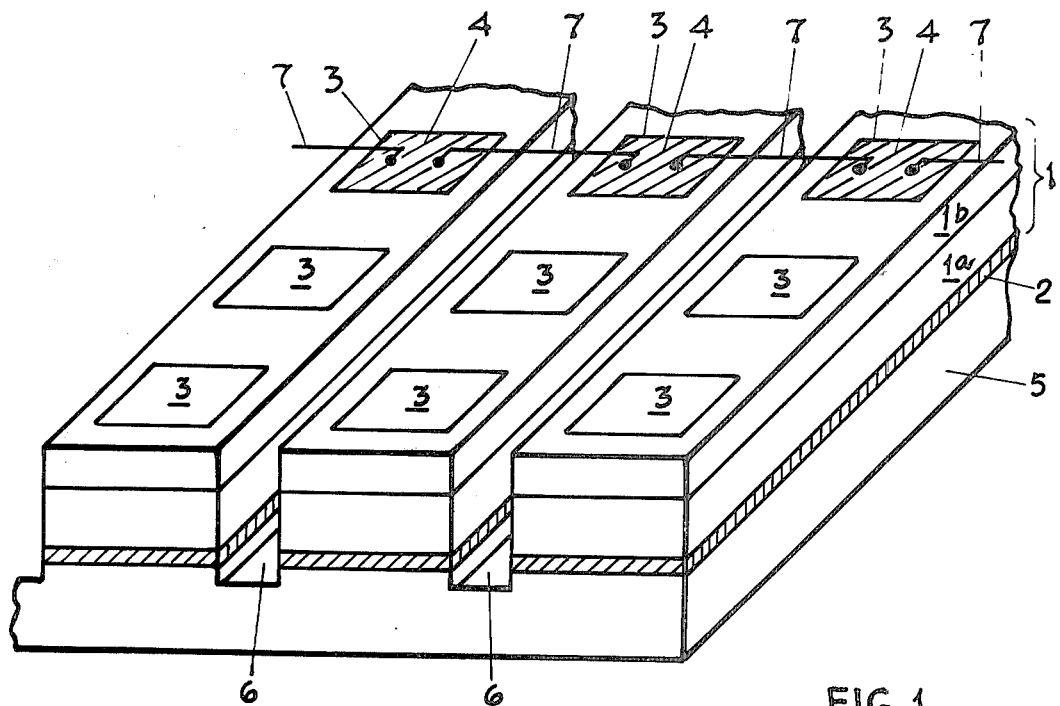

United States Patent [19]
Wickenden

[11] 4,182,025
[45] Jan. 8, 1980

[54] MANUFACTURE OF ELECTROLUMINESCENT DISPLAY DEVICES

[75] Inventor: Dennis K. Wickenden, London, England

[73] Assignee: Elliott Brothers (London) Limited, Chelmsford, England

[21] Appl. No.: 837,611

[22] Filed: Sep. 28, 1977

[30] Foreign Application Priority Data
Oct. 7, 1976 [GB] United Kingdom ............ 41744/76

[51] Int. Cl.² .............................................. B01J 17/00
[52] U.S. Cl. ................................ 29/577 R; 29/580; 29/583; 357/45
[58] Field of Search ............ 29/577, 580, 583, 576 W; 357/45

[56] References Cited
U.S. PATENT DOCUMENTS

| | | | |
|---|---|---|---|
| 3,555,365 | 1/1971 | Forlani | 357/45 |
| 3,673,016 | 6/1972 | Gerstner | 29/583 |
| 3,781,975 | 1/1974 | Ressel | 29/583 |
| 3,918,150 | 11/1975 | Gantley | 29/583 |

*Primary Examiner*—W. C. Tupman
*Attorney, Agent, or Firm*—Kirschstein, Kirschstein, Ottinger & Cobrin

[57] ABSTRACT

In the manufacture of a monolithic light-emitting diode array, electrical isolation between the n-type regions of portions of the array, for example the columns of a matrix array, is effected by mechanically cutting channels between the portions, through the n-type region and the common electrode. This method of forming the isolation channels makes it possible to produce much narrower channels than can be achieved by chemical etching, thus providing a high resolution array.

3 Claims, 4 Drawing Figures

MANUFACTURE OF ELECTROLUMINESCENT DISPLAY DEVICES

This invention relates to the manufacture of electroluminescent display devices of the type consisting of a monolithic array of light-emitting semiconductor diodes (hereinafter referred to as LEDs) and means for applying operating voltages to the diodes, the invention being more particularly concerned with a method of manufacturing an LED array.

A monolithic LED array can be manufactured by a process (hereinafter referred to as a process of the type specified) which includes the steps of providing a slice of n-type semiconductor material, forming a plurality of discrete regions of p-type semiconductor material by diffusing appropriate p-type material or a p-type dopant into one surface of the said slice of n-type material, to delineate the individual diode areas, forming a continuous electrode layer over substantially the whole of the opposite surface of the said slice, that is to say over the wholly n-type surface, this electrode thus initially being common to all the diodes, forming individual electrodes on the surfaces of the regions of p-type material, which electrodes are connected together in groups as required for addressing the array, and forming means for electrically isolating adjacent portions of the array, in respect of the n-type region and common electrode, from one another as required, the whole structure being mounted on a suitable insulating substrate at a convenient stage in the process, usually by bonding the said common electrode layer to the substrate. The said common electrode will be referred to herein as the "back" electrode, and the individual electrodes formed on the separate, p-type, diode areas will be referred to as the "top" electrodes.

For example, in the manufacture of a matrix array consisting of a plurality of LEDs arranged in rows and regularly spaced so as to form columns orthogonal to the rows, the diodes in each column having a common back electrode, and the diodes in each row having individual top electrodes, which are connected together to form a continuous conductor for addressing the row in operation of the device, it is required to provide electrical isolation between the columns in respect of the n-type regions and common electrodes thereof.

One method which has been proposed for achieving the electrical isolation of the n-type regions of adjacent portions of a monolithic LED array from one another consists in forming channels between the portions, through the layers of the structure consisting of the slice of n-type semiconductor material and the common back electrode, by a chemical etching technique. However, since the channels produced by chemical etching are relatively wide, their width being approximately equal to their depth, and since the degree of resolution obtainable with an LED array decreases with increasing pitch of the array (that is to say, with increasing distance apart of adjacent diodes) and hence is limited by the unavoidable width of etched isolation channels, it is not possible to produce a high-resolution array if electrical isolation between adjacent portions of the array is effected wholly by the etching method.

It is an object of the present invention to provide an improvement in the process described above, for the manufacture of a monolithic LED array, whereby a high-resolution array can be obtained.

According to the invention, in the manufacture of an electroluminescent display device of the type consisting of a monolithic array of light-emitting semiconductor diodes and means for applying operating voltages to the diodes, the said array is manufactured by a process of the type specified wherein electrical isolation of adjacent portions of the array from one another, in respect of the n-type region and said common electrode, is effected by forming one or more channels between said portions of the array, wholly or mainly by mechanically cutting through the said slice of n-type semiconductor material and the common electrode layer.

The formation of the isolation channels by mechanical cutting is advantageous since much narrower channels can be produced by this technique than by chemical etching, and hence arrays of higher resolution can be obtained. The degree of resolution is dependent upon the width and uniformity, and accuracy of positioning, of the channels: the cutting is preferably carried out by means of a precision saw of a type for which blades of thickness 0.0015 inch (38 microns) are available, giving channels which are less than 50 microns in width and which can be positioned automatically with an accuracy of 2.5 microns. The use of such a saw thus makes it possible to construct an LED array in which the distance between adjacent diodes on either side of a channel is only 0.20 to 0.25 millimeters.

The whole of each channel may be formed by cutting; alternatively in some cases, if desired, the greater part of each channel may be formed by cutting, leaving a small residual thickness of semiconductor material which can be removed by a chemical or electrolytic technique. It will be understood that in cases where the formation of the channels is effected mainly, but not wholly, by cutting, the cutting is the initial step, so that the width of the channels is determined by the thickness of the cutting means used, the subsequent removal of residual material by other means being carried out in such a manner that the width of the channel is unaffected thereby.

Suitable semiconductor materials for use in the manufacture of the LED arrays include various gallium compounds: a preferred p-type material is zinc-doped gallium arsenophosphide, and preferred n-type materials are gallium arsonophosphide doped with selenium or tellurium, and silicon-doped gallium arsenide. Other suitable compounds include, for example, gallium indium phosphide, gallium aluminium arsenide, and gallium phosphide, in each case containing suitable dopants for producing n-type or p-type material as required. The initial slice of n-type semiconductor material may be of graded composition, and is suitably formed by epitaxial deposition of material of the required composition, or range of compositions, on a substrate of similar or allied composition.

The electrodes of the array consist of layers of suitable metals, for example chromium or titanium overlaid by gold, the layers being formed, for example, by vacuum evaporation of the metals, and the pattern of the top electrodes being delineated by photolithographic techiques; the electrodes may be thickened by electroplating if desired. Suitable materials for the substrates of the arrays include, for example, ceramic alumina, sapphire, and high resistivity silicon.

In a first method of carrying out the process of the invention, p-type semiconductor material, or a p-type dopant, is diffused into the requisite regions of a slice of n-type semiconductor material, for delineating the diode areas, then individual top electrodes are deposited on the p-type regions and a back electrode is formed over the whole of the opposite, wholly n-type, surface of the slice, the back electrode is bonded to a matallised surface of an insulating substrate plate, and a number of channels are then mechanically cut from the exposed top surface of the n-type slice, between adjacent p-type regions, through the said slice and the common electrode layer and to penetrate through the metallised surface of the substrate and possibly slightly into the substrate itself, thus dividing the assembly of semiconductor slice and back electrode into a number of portions electrically isolated from one another. Finally the required connections between groups of the top electrodes are made by a conventional stitch bonding technique.

The above-described method is suitable for the manufacture of relatively small LED arrays, for example matrix arrays of up to 30×30 diodes, but for larger arrays difficulties arise in forming the large number of stitch bonds required, and it is therefore preferred to form the connected groups of top electrodes as continuous beam leads. Accordingly, in a second method of carrying out the process of the invention, which is suitable for the manufacture of larger LED arrays, after delineating the diode areas by diffusion of p-type material or p-type dopant into surface regions of an n-type slice as in the first method, the top electrodes and connections between them are formed as continuous strips overlying groups of p-type regions as required, the back electrode is formed over the whole of the oppposite surface of the n-type slice, the isolation channels are then cut from the back surface of the structure through the back electrode layer and the n-type slice, leaving the top electrode strips intact, and finally the remaining portions of the back electrode layer are bonded to a metallised substrate.

For the manufacture of an array of large area, sections of the array may be produced by the second method described above, the sections then being joined together by stitch bonding at suitable points.

Figure 2:
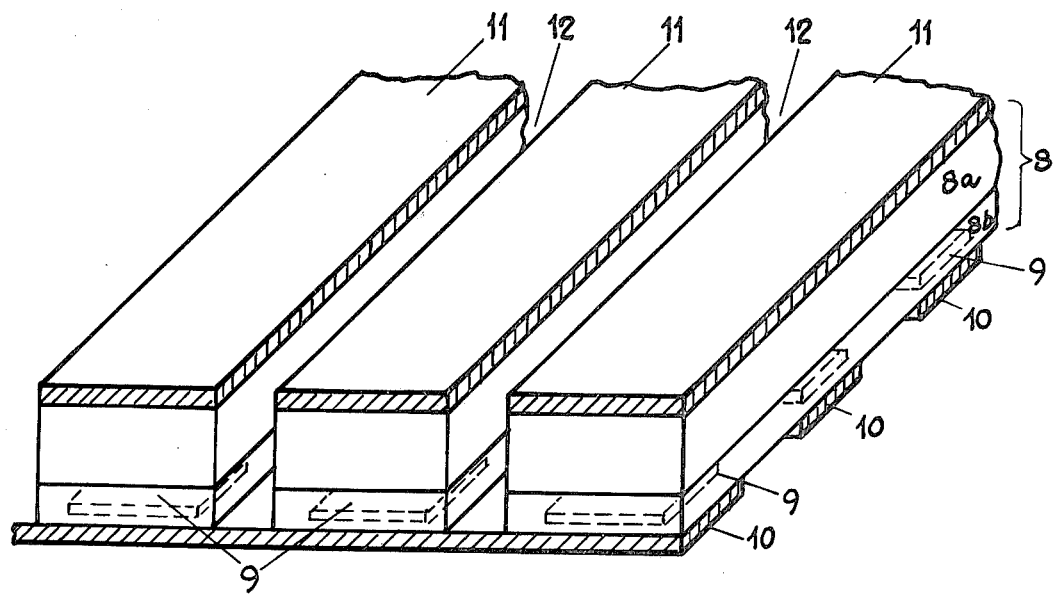
Figure 3:
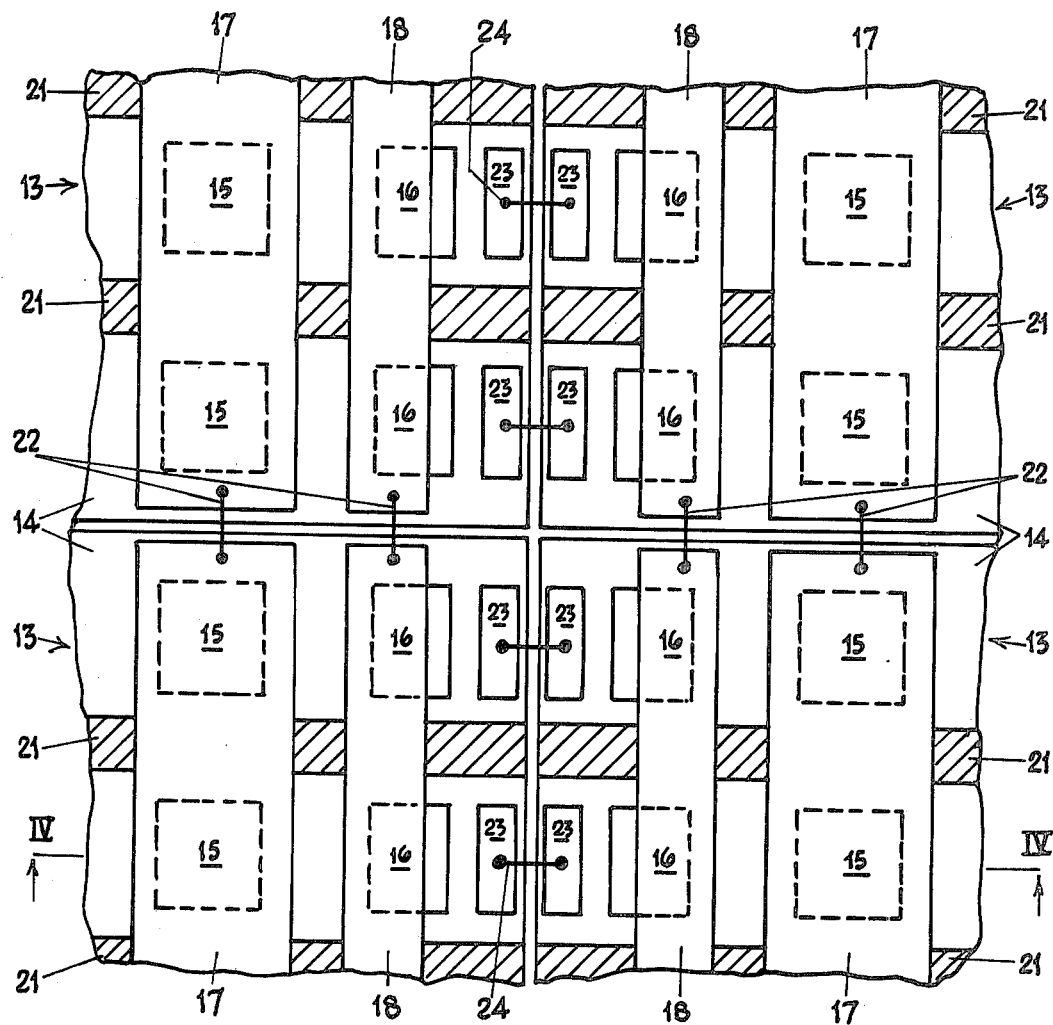
Figure 4:
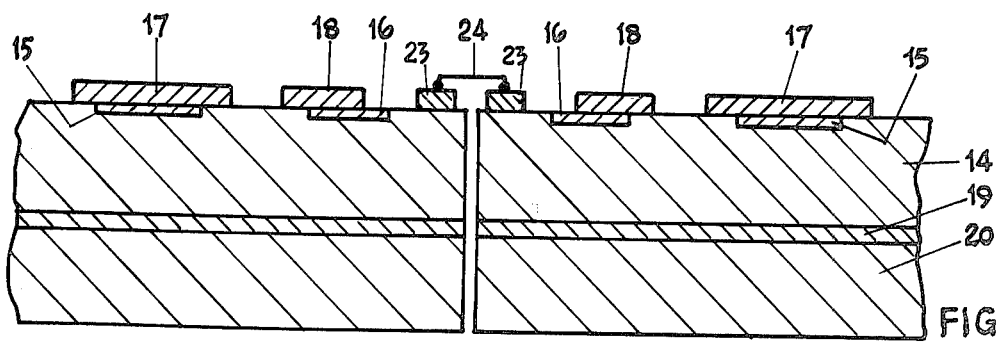

Some specific processes, in accordance with the invention, for the manufacture of high-resolution matrix LED arrays, will now be described by way of example, with reference to the diagrammatic drawings accompanying the Provisional Specification, in which FIG. 1 is a perspective view of part of an array manufactured by the above-mentioned first method, FIG. 2 is a perspective view of part of an array manufactured by the above-mentioned second method, FIG. 3 is a plan view of part of an array formed of sections manufactured by the said second method, and FIG. 4 is a section drawn on the line IV—IV in FIG. 3.

The array shown in FIG. 1 of the drawings consists of columns formed from a rectangular slice of n-type gallium arsenide (GaAs) and gallium arseno-phosphide (GaAsP), 1, with a back electrode 2, forming an ohmic contact, over the whole of one surface of each column, and on the opposite side of each column diffused regions of p-type GaAsP, 3, delineating the diode matrix and covered with individual contact pads 4 which constitute the top electrodes, the p-type regions and top electrodes being arranged in rows, each column including one p-type region of each row, and all the p-type regions being equally spaced apart in both rows and columns; the whole structure is mounted on a ceramic substrate 5. The n-type region of the array is divided into mutually electrically isolated columns by a plurality of parallel channels 6, and the top electrodes are connected together in rows, orthogonal to the columns, by means of conventional stitch bonds 7 (only one row of top electrodes and stitch bonds is shown in the drawing, the remainder of the p-type regions 3 being shown uncovered, for clarity).

In the manufacture of the array shown in FIG. 1, an n-type slice 1 of the desired thickness and constituting the whole area of the array is produced by depositing an epitaxial layer, 1b, of tellurium-doped GaAsP on an initial thin slice, 1A, of silicon-doped GaAs, and the diode matrix is formed by diffusing zinc into all the surface areas 3 in a single operation, then the top electrodes 4, consisting of either a layer of aluminium or a composite layer consisting of titanium overlaid by gold, and the back electrode layer 2, composed of gold or chromium, are formed by vacuum evaporation of the respective metals, the diode matrix pattern being delineated, for the zinc diffusion and metal deposition steps, by photolithographic techniques, in known manner. All these procedures are carried out by well known techniques, and are therefore not described in detail herein. The back electrode layer 2 is then bonded to a metallised surface of the substrate 5, which suitably consists of either high resistivity silicon with a surface layer of thermal or pyrolytic silicon oxide overlaid by gold, or ceramic alumina metallised with gold. The isolation channels 6 are then mechanically cut between the diode columns, from the top surface of the GaAsP layer through the whole of the n-type slice and the back electrode layer and penetrating into the substrate 5, by means of a precision saw with a blade 38 microns thick. The channels thus formed are less than 50 microns wide, and the matrix is so arranged that the diodes, in both the rows and the columns, are equidistant and are not more than 0.25 millimeters apart. Finally, the top electrodes 4 are connected together in rows by stitch bonding.

The array of FIG. 2 is shown in an inverted position, as compared with that of FIG. 1, the layers 11 being the back electrodes of the columns. For the manufacture of this array an n-type semiconductor slice 8 constituting the whole area of the array is first formed by epitaxial deposition of tellurium-doped GaAsP (layer 8b) on a substrate of silicon-doped gallium arsenide (GaAs, layer 8a), the epitaxial layer having a graded composition such that the phosphorus content is increased from a trace in the first film deposited on the GaAs, to 40 at.% in the last film deposited. Zinc is diffused into the surface of the epitaxial n-type layer, to form p-type regions delineating the diode matrix: these diffused regions are not visible in the view shown in FIG. 2, but their positions are indicated by broken lines, at 9. The top electrodes are then formed as continuous strips 10 across the rows of p-type regions by evaporating layers of, first, titanium, and secondly gold, the strips being delineated by photolithographic techniques, and a further thickness of gold is then applied by electroplating, to increase the electrical conductivity and the mechanical strength of the strips: these strips thus constitute beam leads connecting the electrodes of each row. The ohmic back electrode 11 is then formed by evaporating layers of chromium, then gold, on to the whole of the exposed opposite surface of the GaAs slice 8a. Isolation channels 12 are then mechanically cut between the n-type regions of the diode columns, with a precision saw as described with reference to FIG. 1, the incisions being made initially through the back electrode layer 11 and then through the n-type semiconductor layers 8a and 8b, to within 12.5 microns of the top electrode beam leads 10; the channels are completed either by removing the residual n-type GaAsP at the bottom of the channels by a conventional chemical etching process while any exposed diffused areas of p-type GaAsP are protected from contact with the etchant by an inert film, for example of silica or a photoresist material, or by removing the said residual n-type GaAsP by an electrolytic process which selectively removes only n-type GaAsP without affecting other materials, or by photoelectrochemical dissolution. Finally the back electrodes 11 of the matrix columns are bonded to a suitable metallised ceramic substrate (not shown in FIG. 2). This structure, in which the top electrodes and connections between them are in the form of relatively thick continuous beam leads on the diode rows, has the additional advantage of robustness.

FIGS. 3 and 4 show part of a large matrix LED array formed by joining together a plurality of sections 13, each of which is manufactured by the method described above with reference to FIG. 2 and consists of a slice 14 of n-type GaAs-GaAsP with diffused diode areas 15, 16 of p-type GaAsP, top electrode beam leads 17, 18 over the diode rows, and back electrodes 19 bonded to a metallised ceramic substrate 20, the n-type regions of the diode columns in each section being isolated from one another by mechanically cut channels 21. The substrate 20 of each section is cut to the exact area of the whole semiconductor slice of that section, and the substrates are butt-jointed together so that the rows and columns of the respective sections are accurately aligned with one another. The abutting ends of the aligned top electrodes are connected together by stitch bonding, as shown at 22, to form continuous rows in the whole array. To enable the aligned columns of the sections to be mechanically joined and electrically connected together, ohmic contacts 23, composed of a gold-germanium alloy, are formed on the top surfaces of the n-type semiconductor slices adjacent to the abutting edges thereof, and each pair of contacts so formed on adjoining sections is stitch bonded together, as at 24. In order to provide sufficient space to accommodate the contacts 24 without disturbing the pitch of the array, that is to say while keeping the distance between the diode areas, 16, nearest to the respective edges carrying these contacts equal to the distance between all the other pairs of diode areas 15 in the array, the diode areas 16 may be required to be slightly smaller than the other diode areas, as shown in FIG. 3. In addition, the top electrodes 18 on the rows of these smaller diode areas are also somewhat narrower than the top electrodes 17 on the other rows and, in order to avoid close proximity to the contacts 23, are so arranged that they do not cover the portions of the diode areas 16 nearest to said contacts.

I claim:
1. A process for the manufacture of a high resolution monolithic array of light-emitting semiconductor diodes, for use in an eletroluminescent display device, which includes the steps of
   (A) providing a slice of n-type semiconductor material,
   (B) forming a plurality of discrete regions of p-type semiconductor material on one surface of said slice by diffusion of p-type material into said surface, to delineate individual diode areas,
   (C) simultaneously forming individual electrodes on the surfaces of said regions of p-type material and connecting said electrodes together in groups by forming continuous metal strips overlying groups of said p-type regions,
   (D) forming a continuous electrode layer, common to all the diode areas, over substantially the whole of the opposite, wholly n-type, surface of the said slice,
   (E) for electrically isolating adjacent portions of the array from one another as required, forming a plurality of isolation channels each of width less than 50 microns by mechanically cutting from the exposed surface of said common electrode layer, through the said layer and through the said slice of n-type material between adjacent p-type regions, to within a short distance from the said continuous strip electrodes so as to leave a small residual thickness of semiconductor material at the bases of the channels, and removing said residual semiconductor material by chemical means, and
   (F) bonding the remaining portions of the said common electrode layer to a metallized surface of an insulating substrate plate.

2. A process according to claim 1, wherein for the manufacture of a matrix array the said p-type regions are formed in rows on a rectangular slice of n-type semiconductor material, a said continuous electrode strip is formed on each said row of p-type regions, and the said common electrode layer and slice of n-type material are divided into columns orthogonal to said rows of p-type regions by the formation of said channels, each said column containing one p-type region of each said row and the p-type regions being equally spaced apart in both rows and columns.

3. A process for the manufacture of a large area monolithic array of light-emitting semiconductor diodes which includes the steps of manufacturing a plurality of arrays by the process according to claim 2, forming contacts on portions of the exposed surfaces of the n-type slices of said arrays adjacent the edges thereof, arranging the said arrays in abutment with one another, and connecting said contacts on abutting arrays together by stitch bonding.

* * * * *